(12) United States Patent
Lettau (10) Patent No.: US 9,349,109 B2
(45) Date of Patent: May 24, 2016

(54) MEDIA GENERATION AND MANAGEMENT

(75) Inventor: Tyler J. Lettau, Hercules, CA (US)

(73) Assignee: Adobe Systems Incorporated, San Jose, CA (US)

( * ) Notice: Subject to any disclaimer, the term of this patent is extended or adjusted under 35 U.S.C. 154(b) by 1132 days.

(21) Appl. No.: 12/072,955

(22) Filed: Feb. 29, 2008

(65) Prior Publication Data

US 2013/0124572 A1 May 16, 2013

(51) Int. Cl.
*G06F 3/0484* (2013.01)
*G06F 17/21* (2006.01)
*G06F 17/50* (2006.01)
*G06Q 10/06* (2012.01)

(52) U.S. Cl.
CPC ........ *G06Q 10/0631* (2013.01); *G06F 3/04845* (2013.01); *G06F 17/212* (2013.01); *G06F 17/50* (2013.01); *G06F 2203/04803* (2013.01); *G06F 2203/04804* (2013.01); *G06F 2203/04805* (2013.01)

(58) Field of Classification Search
CPC ... G06F 3/04845; G06F 17/212; G06F 17/50; G06F 2203/04803–2203/04805
See application file for complete search history.

(56) References Cited

U.S. PATENT DOCUMENTS

| | | | |
|---|---|---|---|
| 5,608,859 A * | 3/1997 | Taguchi | 715/204 |
| 5,675,752 A * | 10/1997 | Scott et al. | 715/866 |
| 5,714,971 A * | 2/1998 | Shalit | G06F 3/0481 715/792 |
| 6,173,289 B1 * | 1/2001 | Sonderegger et al. | |
| 6,201,539 B1 | 3/2001 | Miller et al. | |
| 6,248,946 B1 | 6/2001 | Dwek | |
| 6,262,723 B1 * | 7/2001 | Matsuzawa et al. | 715/723 |
| 6,434,747 B1 | 8/2002 | Khoo et al. | |
| 6,947,959 B1 * | 9/2005 | Gill | 715/202 |
| 6,950,990 B2 * | 9/2005 | Rajarajan et al. | 715/736 |
| 7,188,316 B2 * | 3/2007 | Gusmorino et al. | 715/764 |
| 7,322,013 B1 * | 1/2008 | Benson | G06F 8/51 715/703 |
| 7,325,199 B1 * | 1/2008 | Reid | 715/723 |
| 7,373,358 B2 * | 5/2008 | Ronnewinkel et al. | |
| 7,478,327 B1 * | 1/2009 | Reid | 715/723 |
| 8,370,224 B2 * | 2/2013 | Grewal | 705/29 |
| 8,510,657 B2 * | 8/2013 | Gilbert et al. | 715/731 |
| 2002/0191028 A1 * | 12/2002 | Senechalle | G09G 5/14 715/800 |
| 2003/0034991 A1 * | 2/2003 | Fitzsimons | G06F 17/3089 345/660 |
| 2003/0086686 A1 * | 5/2003 | Matsui et al. | 386/52 |
| 2003/0097491 A1 * | 5/2003 | Burbidge | G06F 8/38 719/331 |
| 2003/0122966 A1 * | 7/2003 | Markman et al. | 348/563 |
| 2003/0189597 A1 * | 10/2003 | Anderson et al. | 345/778 |
| 2004/0056882 A1 * | 3/2004 | Foreman et al. | 345/716 |
| 2005/0058430 A1 * | 3/2005 | Nakamura et al. | 386/52 |
| 2005/0060759 A1 * | 3/2005 | Rowe et al. | 725/143 |
| 2005/0257241 A1 * | 11/2005 | Faulkner et al. | 725/92 |
| 2006/0008247 A1 * | 1/2006 | Minami et al. | 386/52 |
| 2006/0053384 A1 | 3/2006 | La Fetra, Jr. et al. | |
| 2006/0080335 A1 * | 4/2006 | Freeborg et al. | 707/100 |
| 2006/0109273 A1 * | 5/2006 | Rams et al. | 345/473 |

(Continued)

*Primary Examiner* — Eric J Bycer
(74) *Attorney, Agent, or Firm* — Wolfe-SBMC (57) ABSTRACT

Techniques for media generation and management are described, including retrieving data associated with an asset, processing the data to identify an asset type, the asset type and the data being used to configure an application framework, wherein one or more panels are dynamically determined by evaluating the asset type, the one or more panels being presented in the application framework and at least one of the one or more panels are configured to receive an input initiating an action performed on the asset, and presenting the asset and the one or more panels in an interface coupled to the application framework.

20 Claims, 9 Drawing Sheets

(56) References Cited

U.S. PATENT DOCUMENTS

| | | | |
|---|---|---|---|
| 2006/0178917 A1* | 8/2006 | Merriam et al. | 705/7 |
| 2006/0181966 A1* | 8/2006 | Ohtsuka et al. | 369/30.09 |
| 2006/0265657 A1* | 11/2006 | Gilley | G06Q 30/02 715/730 |
| 2007/0162846 A1* | 7/2007 | Cave et al. | 715/530 |
| 2007/0192759 A1* | 8/2007 | Ishii et al. | 717/113 |
| 2007/0240072 A1* | 10/2007 | Cunningham et al. | 715/764 |
| 2007/0260986 A1 | 11/2007 | Cristofoli | |
| 2007/0261055 A1 | 11/2007 | Kunjithapatham et al. | |
| 2008/0152297 A1* | 6/2008 | Ubillos | G11B 27/034 386/333 |
| 2008/0301128 A1* | 12/2008 | Gandert | G06F 17/30265 |
| 2009/0019383 A1* | 1/2009 | Riley | G06Q 10/10 715/764 |
| 2009/0022474 A1* | 1/2009 | Kubono et al. | 386/52 |
| 2009/0100068 A1* | 4/2009 | Gauba | G06F 17/30274 |

* cited by examiner

MEDIA GENERATION AND MANAGEMENT

FIELD OF THE INVENTION

The present invention relates generally to computer hardware and software architecture. More specifically, techniques for media generation and management are described.

BACKGROUND

Conventional computer software, programs, or applications (hereafter "applications") for creating, editing, and managing (i.e., generating) various types of media (e.g., graphics, animation, audio, video, movies, music, formatted and unformatted data that may be compiled, rendered, or executed using any type of formats and protocols, or others) are typically designed for a single type of media. Problematically, conventional applications are limited to managing one type of media (e.g., pictures, audio, video, graphics, animation, and others) and are not configured for use with more than one type of media. However, demand is increasing for applications that are configured to manage multiple types and formats of media. Further, new forms of media are being developed and created, necessitating the development of new applications configured to manage new types of media.

Conventional solutions typically requiring using multiple applications to perform authoring, editing, or other design functions. As conventional applications become more specialized, users must become adept at using many different types of applications in order to manage multimedia content. Conventional solutions are not configured to combine different media into a single project (i.e., a collection, group, or set of different forms of media). Multimedia projects typically require proficiency with several difficult applications in order to effectively author, edit, or manage multimedia projects, resulting in substantial costs, intensive labor, skilled expertise, and excessive time investments in order to manage various types of media as part of a project.

Thus, a solution for creating and managing projects involving multiple types of media without the limitations of conventional techniques is needed.

BRIEF DESCRIPTION OF THE DRAWINGS

Various examples are disclosed in the following detailed description and the accompanying drawings.

DETAILED DESCRIPTION

Various embodiments or examples may be implemented in numerous ways, including as a system, a process, an apparatus, or a series of program instructions on a computer readable medium such as a computer readable storage medium or a computer network where the program instructions are sent over optical, electronic, or wireless communication links. In general, operations of disclosed processes may be performed in an arbitrary order, unless otherwise provided in the claims.

A detailed description of one or more examples is provided below along with accompanying figures. The detailed description is provided in connection with such examples, but is not limited to any particular example. The scope is limited only by the claims, and numerous alternatives, modifications, and equivalents are encompassed. Numerous specific details are set forth in the following description in order to provide a thorough understanding. These details are provided as examples and the described techniques may be practiced according to the claims without some or all of the accompanying details. For clarity, technical material that is known in the technical fields related to the examples has not been described in detail to avoid unnecessarily obscuring the description.

In some examples, the described techniques may be implemented as an application or as a module or sub-component of another application. The described techniques may be implemented as software, hardware, firmware, circuitry, or a combination thereof. If implemented as software, the described techniques may be implemented using various types of programming, development, scripting, or formatting languages, frameworks, syntax, applications, protocols, objects, or techniques, including C, Objective C, C++, C#, AIR™, Flex™, Java™, Javascript™, Ajax, COBOL, Fortran, ADA, XML, HTML, DHTML, XHTML, HTTP, XMPP, and others. Design, publishing, and other types of applications such as Dreamweaver®, Shockwave®, Fireworks®, and InDesign® may also be used to implement the described techniques. The described techniques may be varied and are not limited to the examples or descriptions provided.

Techniques for media generation and management are described, including retrieving data associated with an asset (e.g., a picture, image, graphic, animation, video, audio, or other media type, regardless of format) and other data that may be used to indicate a media type. In some examples, retrieved data may be processed using an application framework to configure an interface and one or more panels where one or more functions configured to be presented in the panel are determined using the data. As used herein, an "application framework" may refer to one or more applications, functions (e.g., graphics editing or authoring, audio editing or authoring, video editing or authoring, animation editing or authoring, or other types of editing or authoring functions) or processes configured for use as an integrated platform or application that may be used to generate, create, author, edit, modify, or perform another type of operation on a media asset ("asset") or project of any type of media or format. As an example, an application framework may include a video editing function and a graphics editing function, both of which may be presented in an interface. An asset or project, once evaluated and identified by a media type, may determine what functions are provided by an application framework and presented in an application interface. In some examples, an asset may be a movie, photograph, audio clip, music file, image, design, graphic, animation, or any other type of visual, aural, or multimedia-based file, document, or other data. As used herein, a project may be a group, collection, or other aggregation of assets that may be worked on (i.e., generation, creation, authoring, editing, modification, or other operation) to create a multimedia presentation, album, graphic, animation, or other art work. Further, an asset may be presented along with one or more functions in a display, window, palette, or panel, (hereafter "panel"), and used to build a project (i.e., a collection, group, or aggregation of media that may be generated, created, authored, edited, modified, deleted, or otherwise managed together or individually within the context of an application framework using techniques such as those described below). In other examples, the techniques described herein may be implemented differently and are not limited to any specific example or implementation technique described.

Figure 1:
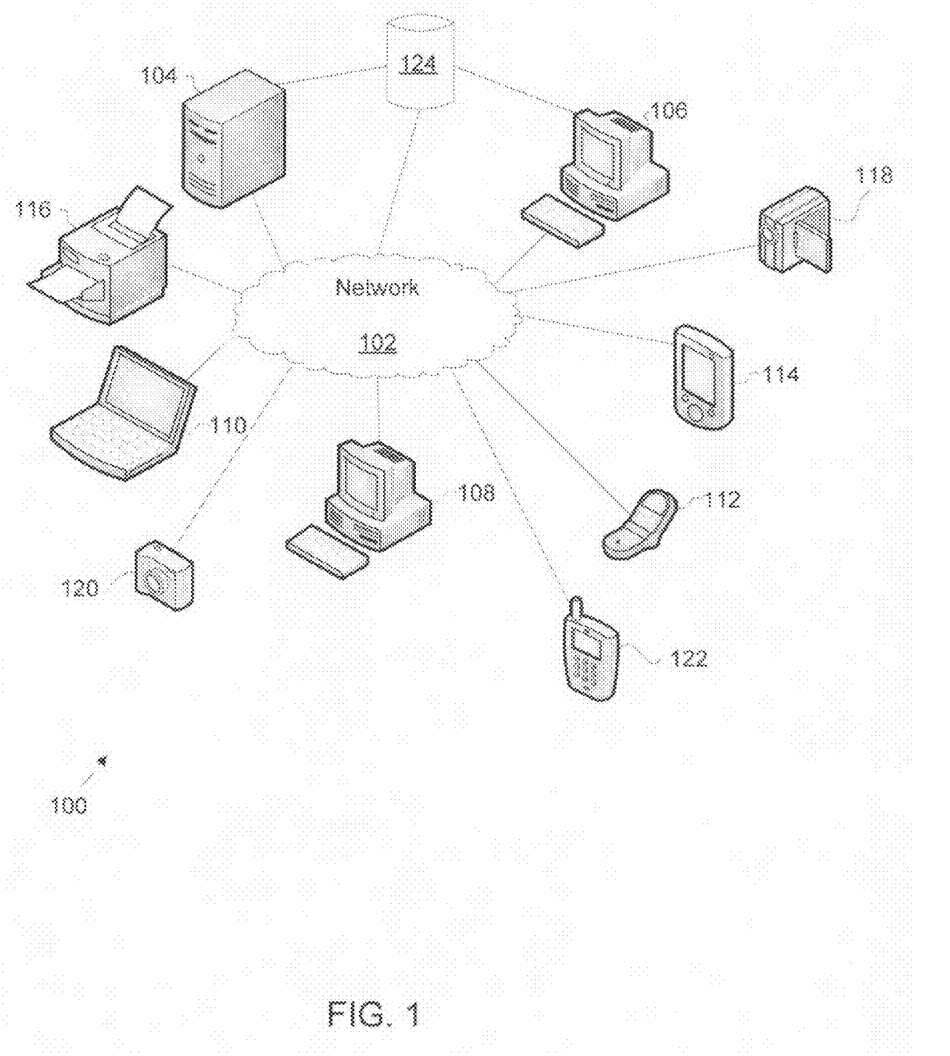
FIG. 1 illustrates an exemplary system for media generation.

FIG. 1 illustrates an exemplary system for media generation. Here, system 100 includes network 102, server 104, clients 106-122, and database 124. System 100 may be used to implement the described techniques for a system and method for media generating application framework. In some examples, network 102 may be implemented using the Internet, a local area network (LAN), wide area network (WAN, municipal area network (MAN), wireless local area network (WLAN), or any other type or topology of network apart from those described herein. Further, direct and indirect connections and couplings may be provided between clients 106-122 across network 102, which may also be implemented using one or more networks. As an example, clients 106-122 may be implemented using endpoint devices such as a desktop computer (e.g., clients 106, 108), laptop or notebook computer (e.g., client 110), mobile computing device (e.g., clients 110, 114, or 122), personal digital assistant (PDA; e.g., clients 112, 122), smart phone (e.g., clients 112 or 122), camera phone (e.g., clients 112, 122), camera (e.g., clients 118, 120), printer (e.g., client 116), and others. System 100 and clients 106-122 are not limited to any particular type, configuration, or quantity and different types, configurations, or quantities may be implemented apart from those described. Further, network connections or couplings between the above-described elements in system 100 may be varied and are also not limited to the examples provided.

In some examples, clients 106-122 may be implemented using various types of endpoint devices. For example, clients 106-108 may be implemented using endpoint devices such as personal computers (PC) or other types of computing devices. Further, clients 110-122 may be implemented as notebook/laptop computers, cell/smart phones, personal digital assistants (PDAs), or printers, respectively. In other examples, clients 106-122 may be implemented using a different type of endpoint or computing device.

In other examples, server 104 may be implemented and configured to deliver (i.e., serve) content, information, or data requested by one or more of clients 106-122. For example, content requested by client 106 may be performed using a web browsing application (not shown) installed on client 106. Content may include text, documents, files, images, photos, applications, or other types of information or data. When requested from server 104, content may be delivered to a requesting client (i.e., clients 106-122). In other examples, server 104 may be a computer or computing device configured to perform one or more processes for a given purpose (e.g., ad server, web server, content server, application server, web services, gateway, and others). When requested from server 104, content may be delivered to a requesting client (i.e., clients 106-122). The described techniques may be implemented using the above-described system and topology. In some examples, a system and method for media generating application framework may be used locally on one or more of clients 106-122. In other examples, an application framework for implementing the described techniques for media generation and management may be implemented at a single location (e.g., server 104), remotely, or in a distributed manner using server 104 and one or more of clients 106-122. Further, other system configurations, topologies, clients, end and intermediate devices, and implementation techniques may be used and are not limited to those described above.

Figure 2:
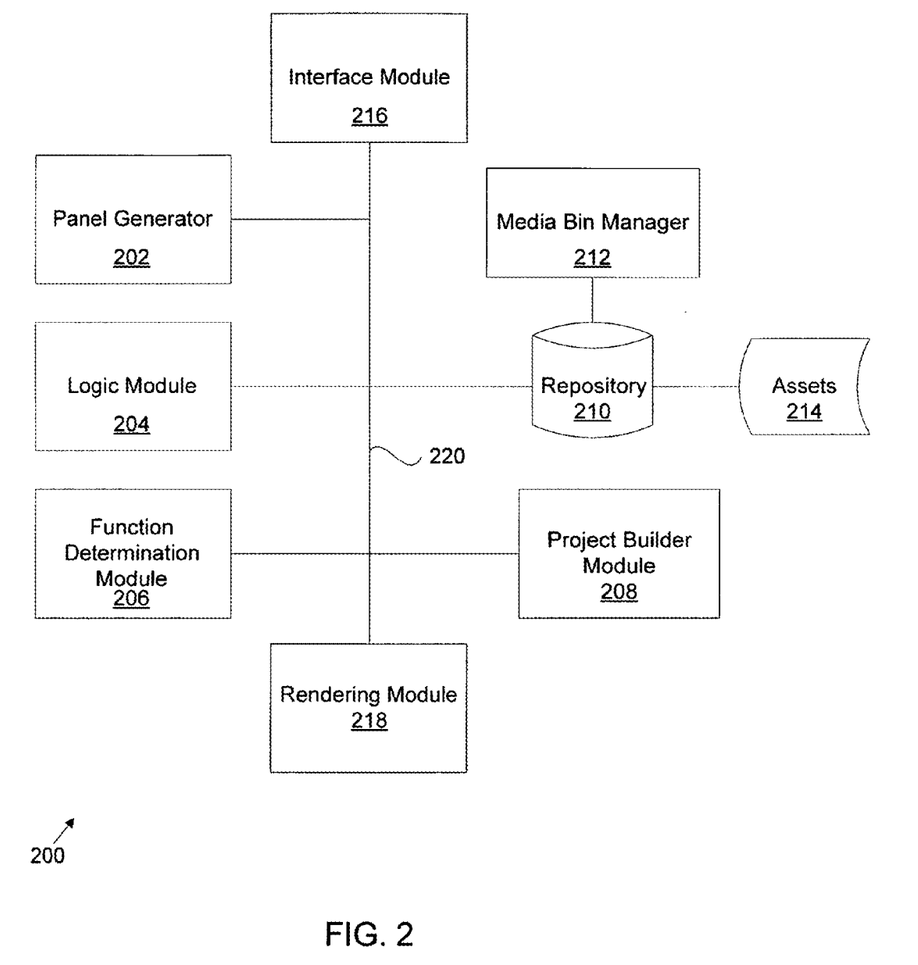
FIG. 2 illustrates an exemplary application architecture for media generation.

FIG. 2 illustrates an exemplary application architecture for media generation and management. Here, application 200 includes, panel generator 202, logic module 204, function determination module 206, project builder module 208, repository 210, media bin manager 212, assets 214, interface module 216, rendering module 218, and data bus 220. In some examples, panel generator 202, logic module 204, function determination module 206, project builder module 208, repository 210, interface module 216, and rendering module 218 may be configured to transfer data between each other using data bus 220. In other examples, repository 210 may be a remote repository, which may be networked directly or indirectly to application 200. Data may be stored in either repository 210 or a remote repository (not shown), and data may be organized into files, or assets. Assets may include documents, images, text, applications, program or software code, photos, or other type of data that may be grouped together as a stream of bits (e.g., "1," "0," or other data representation using binary, tertiary, or other types of number systems using a different mathematical base) that may be opened, accessed, launched, executed, run, downloaded, or otherwise operated upon as a single unit or instance. Further, assets may be advertisements, documents, articles, web sites and pages, videos, web services-delivered content and applications, or any other single or multi-media content formatted using different applications (e.g., desktop, web browsing, messaging, e-mail, spreadsheet, and others), but managed using application 200. In some examples, asset retrieved from repository 210 may be accessed, retrieved, opened, rendered, analyzed, evaluated, executed, launched, displayed, or otherwise presented (hereafter "presented") based on a media type associated with the retrieved asset. For example, a web site having video and audio data may be streamed as a data stream from repository 210. As another example, an audio file may be downloaded, retrieved, streamed, or otherwise accessed from repository 210.

In some examples, application 200 may be configured for data communication with one or more other modules, applications, operating systems, or other hardware, software, or firmware components. In other examples, interface module 216 may be configured to provide other data communication capabilities or perform other functions apart from those shown and described. Interface module 216 may be configured to provide a list of assets 214 located in repository 210 by communicating with media bin manager 212. Here, assets 214 may be a group of assets or a single asset. Media bin manager 212 may be configured to sort assets 214 based on various types of media formats, data, parameters, attributes, or other characteristics. Data may be system input, user input, or a combination thereof. For example, a list of assets 214 may be generated based on asset type, date of asset creation, asset creator, or other types of data.

In some examples, after retrieving assets 214, data may be transferred to logic module 204 for processing. In other examples, logic module 204 may be configured to provide or generate control signals for application 200 and the described elements. Here, data may be sent to rendering module 218 to generate graphics, to function determination module 206 to configure functions, or to panel generator 202 to configure a panel. As an example, a panel may be dynamically determined by evaluating an asset. In some examples, an asset may be evaluated based on asset type or metadata that may be used to dynamically determine what functions, processes, or applications are presented within an application framework for a given asset. For example, when an animation-type asset is selected, application framework, using logic module 204 and panel generator 202, may determine that a graphics editing function, an animation effects function, an animation transition function, or other types of applications or functions may be configured for use with an application framework and presented in an interface (not shown). In other examples, the above-described application framework and dynamic determination functions for panels may be performed differently and is not limited to the descriptions provided.

In some examples, a combination of output from any of the described modules may be output to interface module 216. Further, logic module 204 may be configured to output data associated with assets 214 to panel generator 202, rendering module 218, or function determination module 206. In some examples, using data output from logic module 204, panel generator 202 may present a panel (not shown). In other examples, data from logic module 204 may be sent to rendering module 218 to render a graphical display. In still other examples, data from logic module 204 may be sent to function determination module 206 to configure functions or other elements presented on a panel (not shown) for use with manipulating assets 214. Separately or together, panel generator 202, function determination module 206, and rendering module 218 may output to interface module 216, to present a panel associated with assets 214.

As determined by function determination module 206, in some examples, a panel may be configured for use when generating (i.e., authoring, creating, designing, or the like) or managing (e.g., editing, changing, working with, or otherwise modifying) a project (not shown). In some examples, a project may couple two or more assets 214, either in part or whole. As an example, a video file and an audio sound track file may be coupled together in a movie (i.e., a project). As another example, an animation effect may be applied to an object used in a graphic presentation. As yet another example, two or more objects (e.g., assets 214) may be retrieved as data from repository 210 by logic module 204 and, using project builder module 208 and media manager 212, used to generate a project. Using markup data associated with each object, project builder module 208 may initiate a call to function determination module 206, panel generator 202, rendering module 218, and interface module 216 to determine what functions, processes, routines, procedures, or the like are invoked to manage assets. Further, once function determination module 206 has determined that assets are media are of a given type, data is sent to panel generator 202 to configure an interface that presents functionality for managing the assets. As another example, a project may be created using a single asset.

In still other examples, a project may be an identified as an asset and stored in repository 210 and indexed using media bin manager 212. Alternatively, a project may be stored in repository 210 or indexed through media bin manager 212. In yet other examples, a project may be transferred to or stored in a different repository (not pictured). A different repository may be implemented at a remote location such as a server, website, or other location. Here, when a project is created, data may be sent to project builder module 208 to configure a project type. Data identifying a project type may be output to panel generator 202, media bin manager 212, interface module 216, or any other module shown. Further, panel generator 202, logic module 204, function determination module 206, media bin manager 212, rendering module 218, interface module 216, or project builder module 208 may be used individually or in combination with each other to, for example, form one or more modules with multiple functions, a single module, or others. In other examples, application 200 and the above-described elements may be implemented differently in design, function, architecture, topology, configuration, or other aspects and are not limited to the examples provided.

Figure 3A:
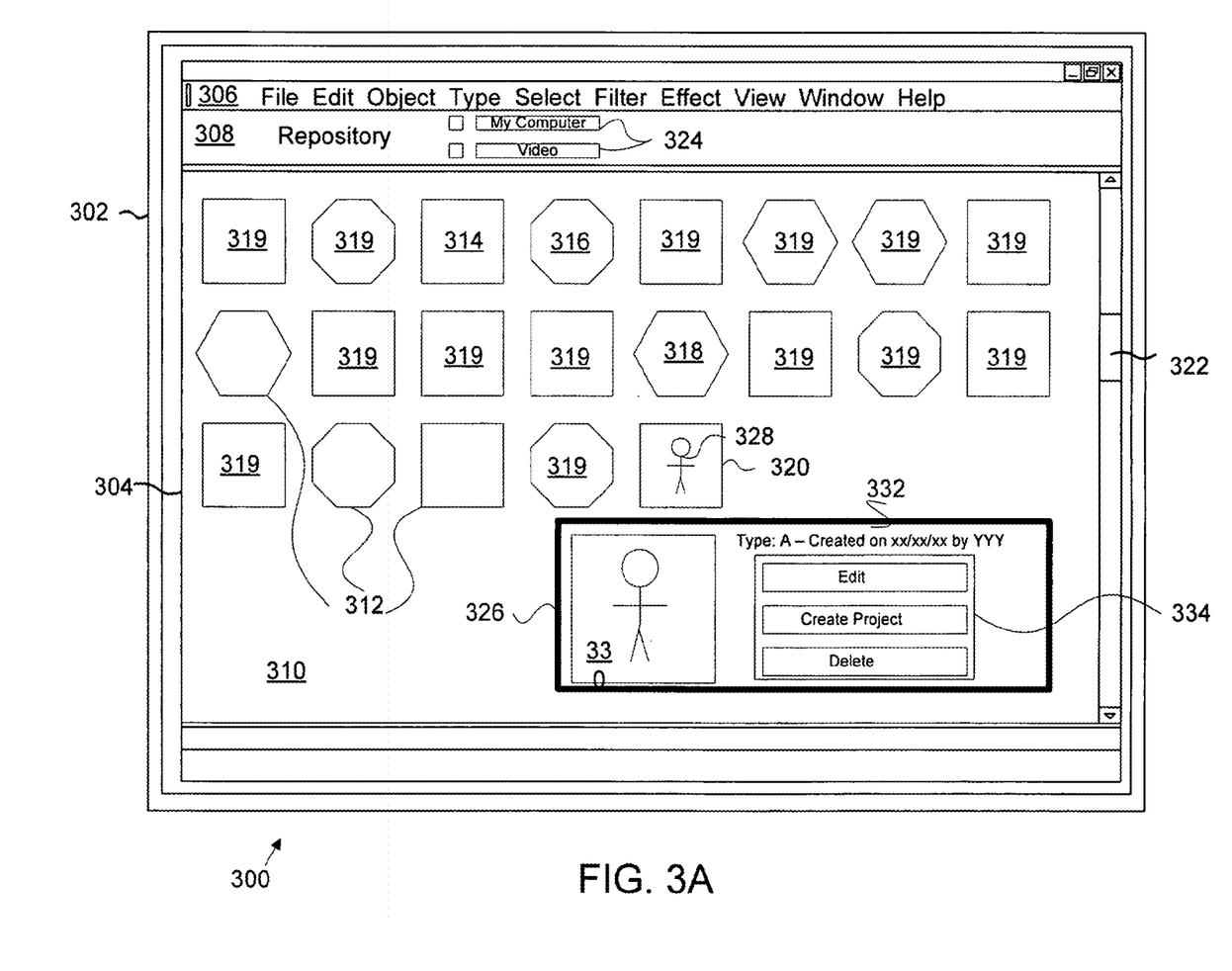
FIG. 3A illustrates an exemplary media generation and management interface.

FIG. 3A illustrates an exemplary media generation interface. Here, interface 302 includes panel 304, menu panel 306, bar 308, panel 310, asset 312-319, selected asset 320, scroll bar 322, repository sorting tools 324, panel 326, asset preview 328, asset preview 330, selected asset data 332, and asset function box 334. In some examples, assets 314-319 may be implemented using various shapes, designs, or other configurations. In other examples, assets 312-319 may be presented as a list, an icon, an avatar, or another type of visual representation. Further, asset preview 328 may be used to preview assets 314-319. In some examples, the number of icons (i.e., assets 312-319) presented in panel 310 may be too large or numerous to fit in the space provided on panel 310, and scroll bar 322 may be used to view other assets. As another example, navigational arrows (not shown), or other navigation functions may be used to view assets 314-319 in panel 310. Repository sorting tools 324 may be implemented using drop-down menus, text entry fields, or other techniques in order to specify or input data associated with assets stored in panel 310. Further, repository sorting tools 324 may be implemented to specify locations of assets, which may be informatively presented in panel 310. As yet another example, one or more repository sorting tools 324 may be used to manage panel 310. In still other examples, interface 302 and the above-described elements may be varied in layout, design, function, appearance, or other aspects and are not limited to those shown and described.

In some examples, panel 310 may include asset 312. Here, asset 312 represents any type of media file, document, object, image, project, or other item, regardless of type, format, or content, stored in a location (not shown). In some examples, a location may be local, remote, or combination thereof. The size, number, configuration, placement, and location of icons representing assets 312-319 in panel 310 may be varied and is not limited to the examples shown.

In some examples, assets 312-319 presented in panel 310 may be using different shapes such as a square (e.g., asset 314), octagon (e.g., asset 316), hexagon (e.g., asset 318), or others. As another example, asset preview 328 may be a reproduction or copy of one or more of assets 312-319. Further, asset preview 328 may be presented as a symbol, icon, avatar, or another element configured to represent one or more of assets 312-319. In other examples, asset preview 330 may present widgets, menus, buttons, text entry fields or other tools that may be used to play one or more continuous assets. As used herein, a continuous asset may be an asset that changes over time (e.g., a movie or audio file, but not a picture.

In some examples, an asset (e.g., asset 312) may be presented as a selected asset (e.g., asset 320), having been selected based on input received from a system, user, or other source. If an icon is selected, panel 326 may be presented. In some examples, panel 326 may include, but is not limited to, an asset preview 330, selected asset data 332, asset function box 334, or other data or functions associated with selected asset 320. In other examples, asset preview 330 may be generated using data retrieved from a local, remote, or other location. In other examples, asset preview 330 may be larger, smaller, or substantially similar in size to asset preview 328. As an example, the size of asset preview 330 may be varied. In still other examples, asset preview 330 may be a reproduction of asset preview 328. Further, asset preview 330 may be an image not included in or associated with selected asset 320. Still further, interface 302 and the above-described elements may be varied in layout, design, function, appearance, or other aspects and are not limited to those shown and described.

Figure 3B:
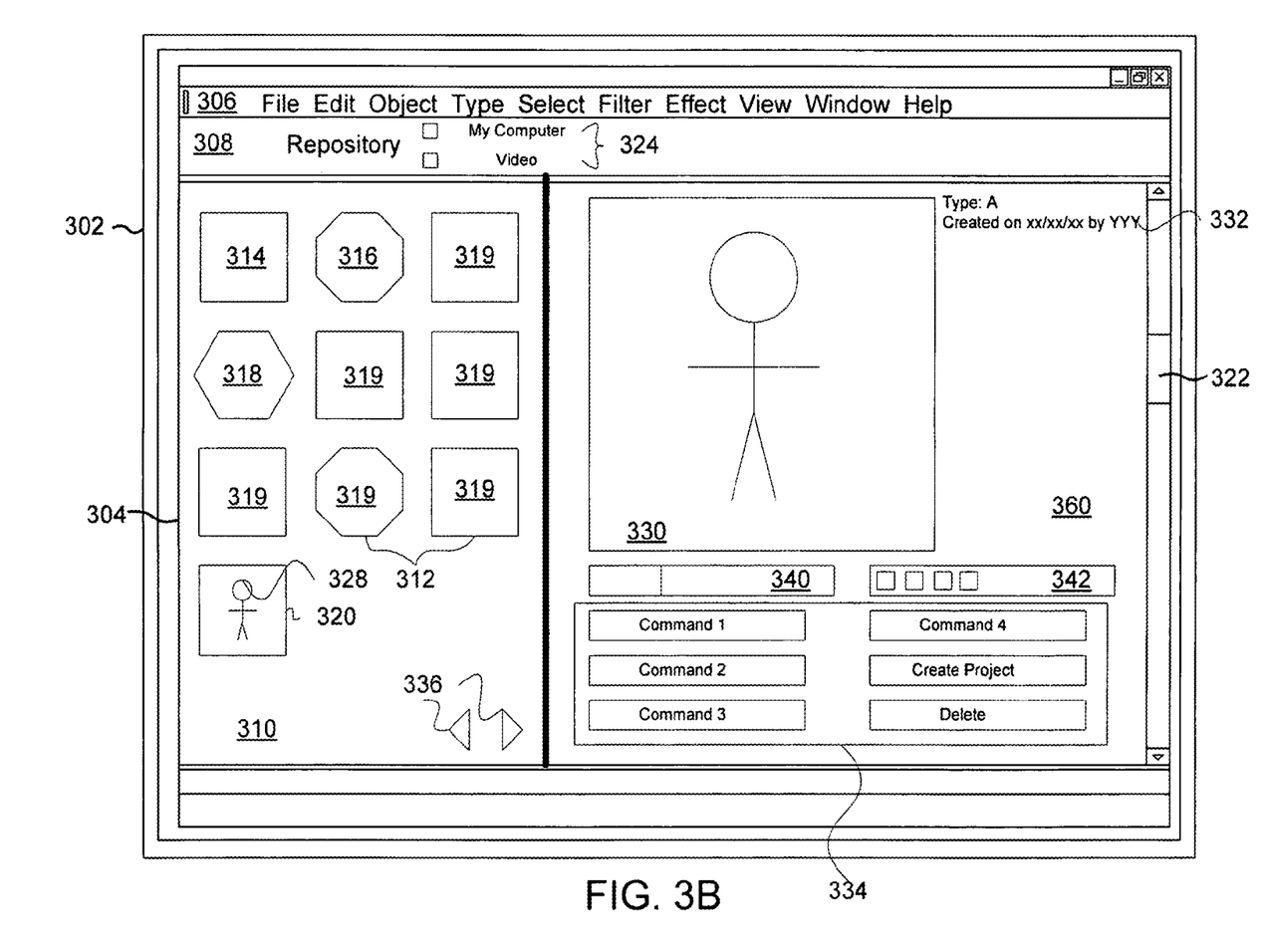
FIG. 3B illustrates another exemplary media generation and management interface.

FIG. 3B illustrates another exemplary media generation interface. Here, interface 302 is shown with panel 304, menu panel 306, bar 308, panel 310, asset 312, assets 314-318, selected asset 320, scroll bar 322, repository sorting tools 324, asset preview 328, asset preview 330, selected asset data 332, asset function box 334, repository navigation tools 336, asset progress bar 340, asset group 342, and asset editing panel 360. Repository navigation tools 336 may allow access to one or more of assets 312-319. More, fewer, or different types of assets other than assets 312-319 may be displayed in panel 310 at one time. If assets 312-319 are displayed using space in panel 310, repository navigation tools 336, in some examples, may be used to navigate between assets 312-319 or others. In some example, repository navigation tools 336 may be implemented using arrows, page selection tools, scroll bars, or other user interface elements ("elements"). As an example, scroll bar 322 may be used to navigate asset editing panel 360. In other examples, asset editing panel 360 may be navigated using arrows, page selection tools, or other elements.

Input may be provided indicating selection of asset 312, which, when selected, may become selected asset 320. In some examples, the input indicating the selection of asset 312 may be provided by a system, user, or other source. If an asset is selected, asset editing panel 360 may be invoked and presented in order to present a selected asset (e.g., selected asset 320). As an example, asset editing panel 360 may include asset preview 330, selected asset data 332, asset function box 334, asset progress bar 340, asset group 342, or other data, information, or elements apart from those shown. Further, asset editing panel 360 may be used to manipulate selected asset 320, including but not limited to, cutting, editing, scaling, shortening, or changing the color, size, shape, or other attributes of an icon, element, or other representation associated with selected asset 320. In some examples, an asset or project being created, modified, or deleted using asset editing panel 360 may be stored as an asset or, in some examples, as a project asset editing panel 360 in, for example, repository 312. Further, an asset or project being created, modified, or deleted using asset editing panel 360 may be converted to a different format and stored in a different location, which may be a local, remote, or other type of repository (e.g., repository 210 (FIG. 2)).

In some examples, asset group 342 may presents representations of assets 312-319 or others that may be selected for use when creating or modifying selected asset 320. In some examples, asset group 342 may include items that are related to a project using selected asset 320. For example, items may include photos taken on a given date, media created by a given user, or other assets that may share a common characteristic or are otherwise specified as a group, regardless of whether a specification is user or system-made. Here, asset group 342 may be defined by a user, system, or a combination thereof. In some examples, one, both, or none of asset progress bar 340 or asset group 342 may be presented in asset editing panel 360. Asset group 342 may include asset preview 328 or reproductions, icons, symbols, avatars, or other elements associated with assets 314-318. Further, group 342 may be identified as a group of assets stored in a repository (e.g., repository 210 (FIG. 2). Asset progress bar 340 may be configured to allow a continuous asset to be manipulated at a given point. In some examples, asset progress bar 340 may be presented differently than shown and is not limited to the descriptions provided.

In some examples, asset function box 334 may include various tools configured for use with selected asset 320. As an example, asset function box 334 may be implemented to present editing tools, project building tools, or other options that may be invoked by a user working (i.e., creating, editing, authoring, deleting, or otherwise modifying) a project or asset in interface 302. In another example, selected asset 320 may be accessed at a remote location (e.g., using tools located in menu bar 306) or stored in repository 310. In other examples, asset preview 330 may be generated using data retrieved from a local remote, or distributed (i.e., local and remote) location.

In some examples, asset preview 330 may be presented larger, smaller, or substantially similar in size as, asset preview 328. Alternatively, the size of asset preview 330 may be varied in other attributes (e.g., color, shape, position in panel 304). In other examples, asset preview 330 may be a reproduction of asset preview 328. In still other examples, asset editing panel 360 interface 302 and the above-described elements may be varied in layout, design, function, appearance, or other aspects and are not limited to those shown and described.

Figure 3C:
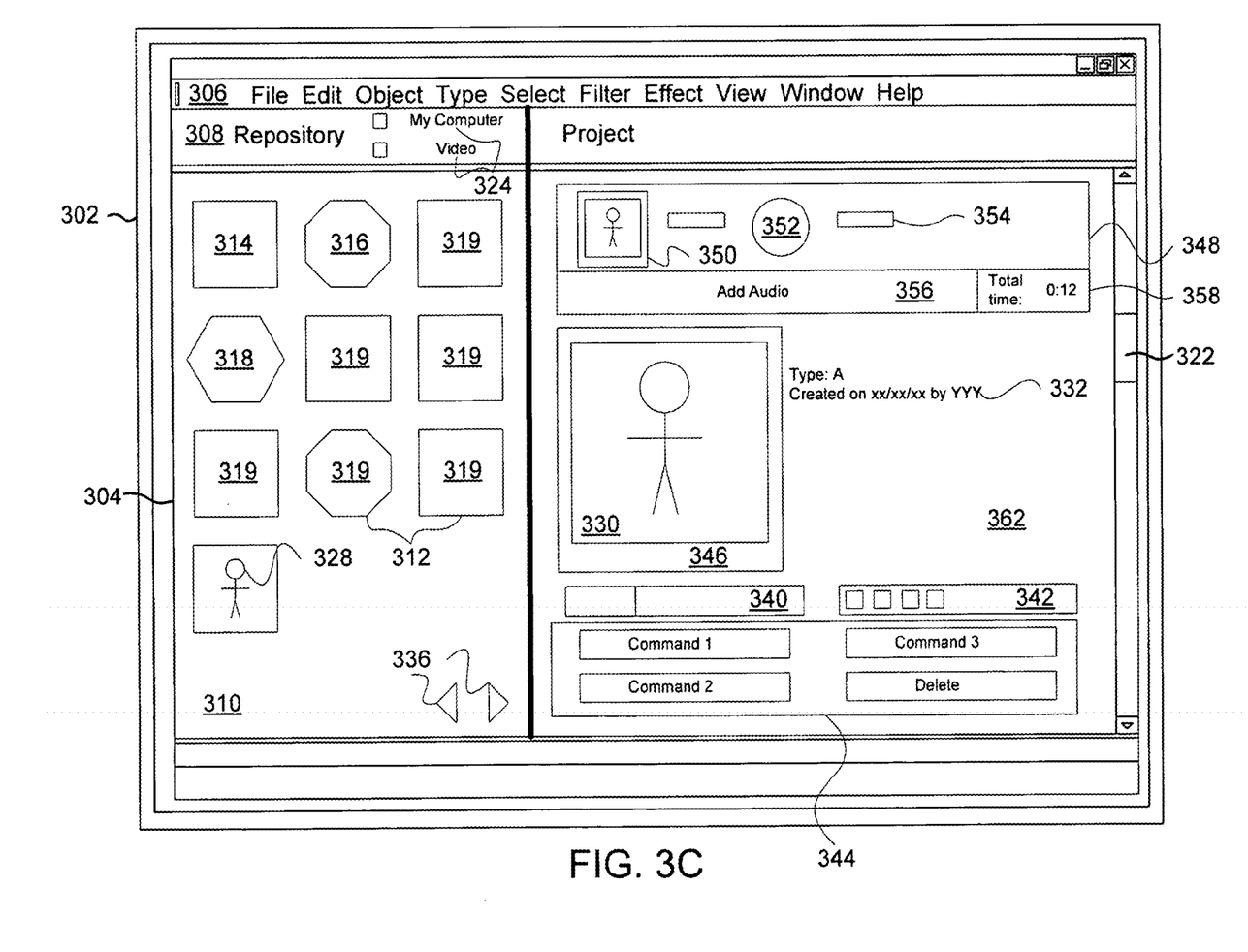
FIG. 3C illustrates a further exemplary media generation and management interface.

FIG. 3C illustrates a further exemplary media generation interface. Here, interface 302 includes panel 304, menu bar 306, bar 308, repository 310, asset 312, assets 314-318, scroll bar 322, repository sorting tools 324, asset preview 328, asset preview 330, selected asset data 332, repository navigation tools 336, asset progress bar 340, asset group 342, project tool box 344, project preview panel 346, project builder panel 348, selected asset 350, space 352, project transition action 354, project audio track 356, project length 358, and project panel 362. Asset 312 may be retrieved and presented (i.e., rendered and displayed) in project panel 362 to construct a project. As an example, selected asset 350 may be presented asset preview 330 in project preview panel 346. In some examples, an asset (e.g., one or more of assets 312-319) selected from repository 310 may be presented similarly to or substantially similar to selected asset 350 in project panel 362. As another example, an asset may be accessed or stored in a remote location. Selected asset 350 may be created, authored, edited, modified, or otherwise managed using tools presented in project tool box 344. The quantity of tools provided in project tool box 344 may be varied and are not limited to the examples shown. In other examples, tools presented in project tool box 344 may be associated with selected asset 350 or other assets. In other words, tools presented in project tool box 344 may be the same or substantially the same for different assets or projects or different tools may be presented for different types of assets or projects, as determined by a user or a system (e.g., application 200 (FIG. 2)). As another example, tools in project tool box 344 may be configured for use with selected asset 350.

In some examples, the layout of project builder panel 348 may be varied. For example, project builder panel 348 may be configured to present selected asset 350, space 352, project transition action 354, or other elements differently. Here, work from project panel 362 may be stored as an asset in a local, remote, combination (i.e., a distributed repository comprising local and remote storage elements), distributed, or other type of repository. In yet other examples, work from project panel 362 may be converted to a different format and stored differently. In still other examples, project panel 362 and the above-described elements may be varied in layout, design, function, appearance, or other aspects and are not limited to those shown and described.

Here, project panel 362 is shown with project builder panel 348, which includes, but is not limited to, selected asset 350, space 352, project transition action 354, project audio track 356, and project length 358. In some examples, project builder panel 348 may be used to create or author, edit, delete, or otherwise modify a new project. For example, asset 312 may be dragged into, or otherwise placed, in project builder panel 348 using, for example, space 352. As another example, project builder panel 348 may be configured to allow stacking, coupling, joining, simultaneous or substantially simultaneous presentation, or other actions associated with assets using project panel 362. In other examples, asset 312 may be placed into project audio track 356 and manipulated. In still other examples, an asset may be retrieved from various locations (e.g., local, remote, combination, or distributed repositories) and placed in project builder panel 348. Further, assets, depending upon type may be limited in use in project builder panel 348 (e.g., a picture, image, or video-based asset may not be used with project audio track 356, and others). Project length 358 may be another panel, widget, tool, or other element configured to indicate the temporal duration of a given asset or project. For example, project length 358 may be indicated using numbers, a clock, a progress bar, or other techniques.

In some examples, project transition action 354 may be an element presented in project builder panel 348 that is configured to create or manage transitions between assets associated with a given project. Here, project transition action 354 may be an action determined by user input, system input, or a combination thereof. In other examples, project transition action 354 may not be present when working (i.e., creating or authoring, editing, deleting, or otherwise modifying) with a given asset or project. Further, space 352 may be presented as space within project builder panel 348 that is configured to receive an asset or a project. Alternatively, space 352 may be omitted from presentation or use with project builder panel 348. In other examples, interface 302 and the above-described elements may be varied in layout, design, function, appearance, or other aspects and are not limited to those shown and described.

Figure 3D:
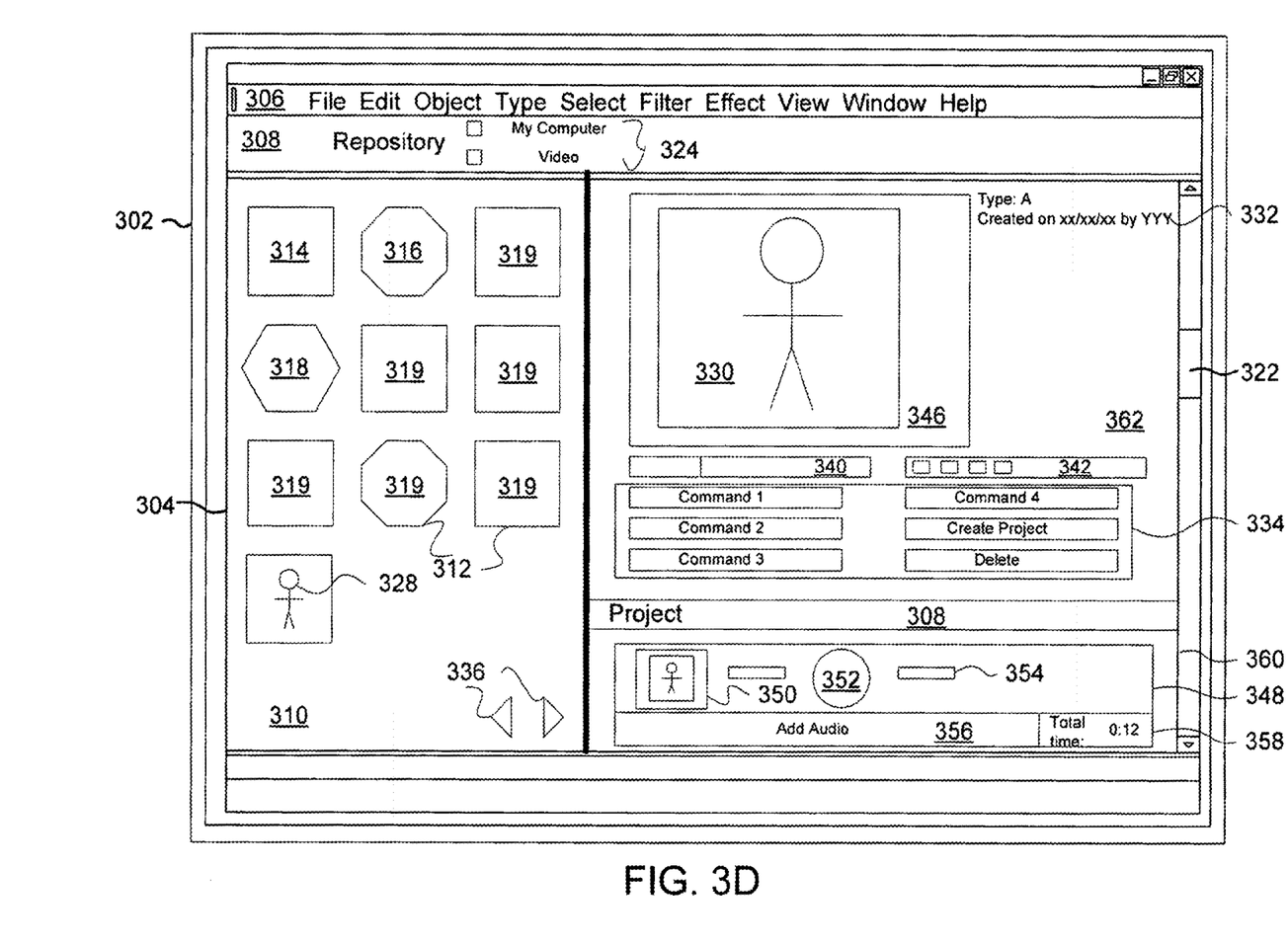
FIG. 3D illustrates yet another alternative exemplary media generation and management interface.

FIG. 3D illustrates yet another exemplary media generation and management interface. Here, interface 302 includes panel 304, menu bar 306, bar 308, repository 310, asset 312, assets 314-318, scroll bar 322, repository sorting tools 324, asset preview 328, asset preview 330, selected asset data 332, asset function box 334, repository navigation tools 336, asset progress bar 340, asset group 342, project preview panel 346, project builder panel 348, selected asset 350, space 352, project transition action 354, project audio track 356, project length 358, project panel 362, and asset editing panel 360. In some examples, interface 302 may be presented with repository 310, project panel 362, asset editing panel 360, or combination thereof. In other examples, more, fewer, or different elements apart from those shown may be presented. Further, selected asset 350 may appear in asset editing panel 360. In other examples, asset editing panel 360 may display selected asset 350 as reproduced preview asset 330 or in project preview panel 346, or some combination thereof. Still further, repository 310, asset editing panel 360, or project panel 362 may be moved, rearranged, minimized, or otherwise modified in appearance, location, layout, design, or function in interface 302. In other examples, asset editing panel 360 may not be presented in interface 302. In still other examples, more, fewer, or different elements (e.g., project tool box 344) may be presented in interface 302. Alternatively, interface 302 and the above-described elements may be varied in layout, design, function, appearance, or other aspects and are not limited to those shown and described.

Figure 4:
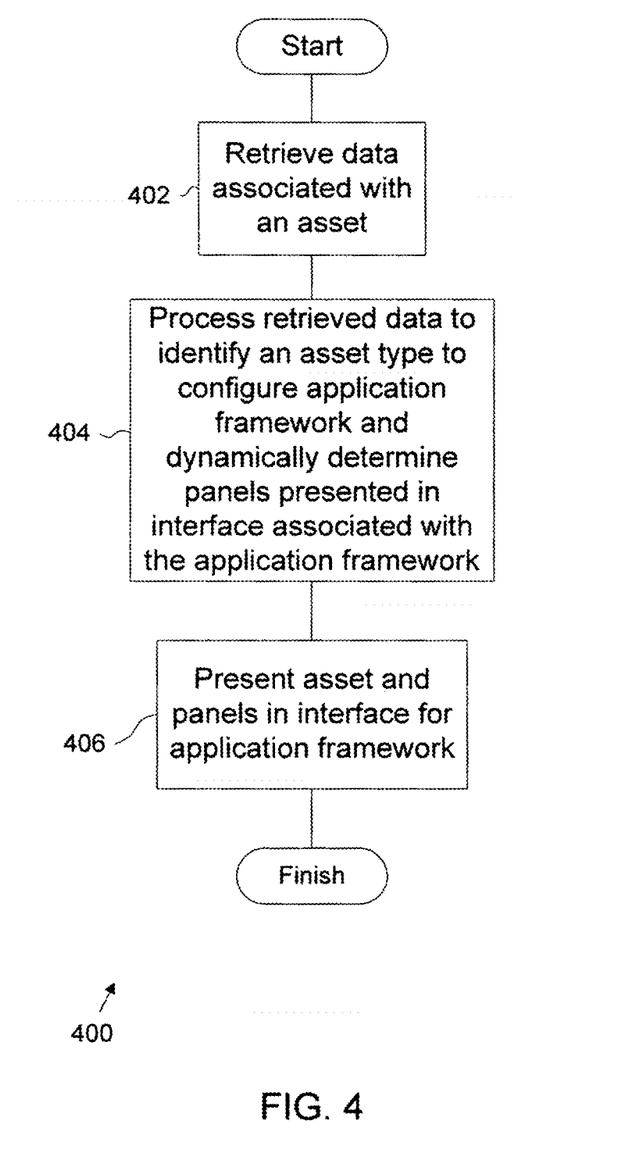
FIG. 4 illustrates an exemplary process for media generation.

FIG. 4 illustrates an exemplary process for media generation. Here, process 400 starts by retrieving data associated with an asset from a location (402). In some examples, a location may be a local, remote, combination (i.e., local and remote), or distributed repository, such as those described above. Once data associated with an asset is retrieved, processing occurs using an application framework (e.g., application 200 (FIG. 2)) to dynamically determine the functions or processes to be presented in a panel (e.g., project builder panel 348, project panel 362, and others) configured for presentation with an application framework and used to build (i.e., creating and managing) an asset or a project (404). After a panel is configured, an asset may be presented with one or more functions in the panel and used to build or manage a project (406). In other examples, the above-described process may be varied and is not limited to the processes or sub-processes described above.

Figure 5:
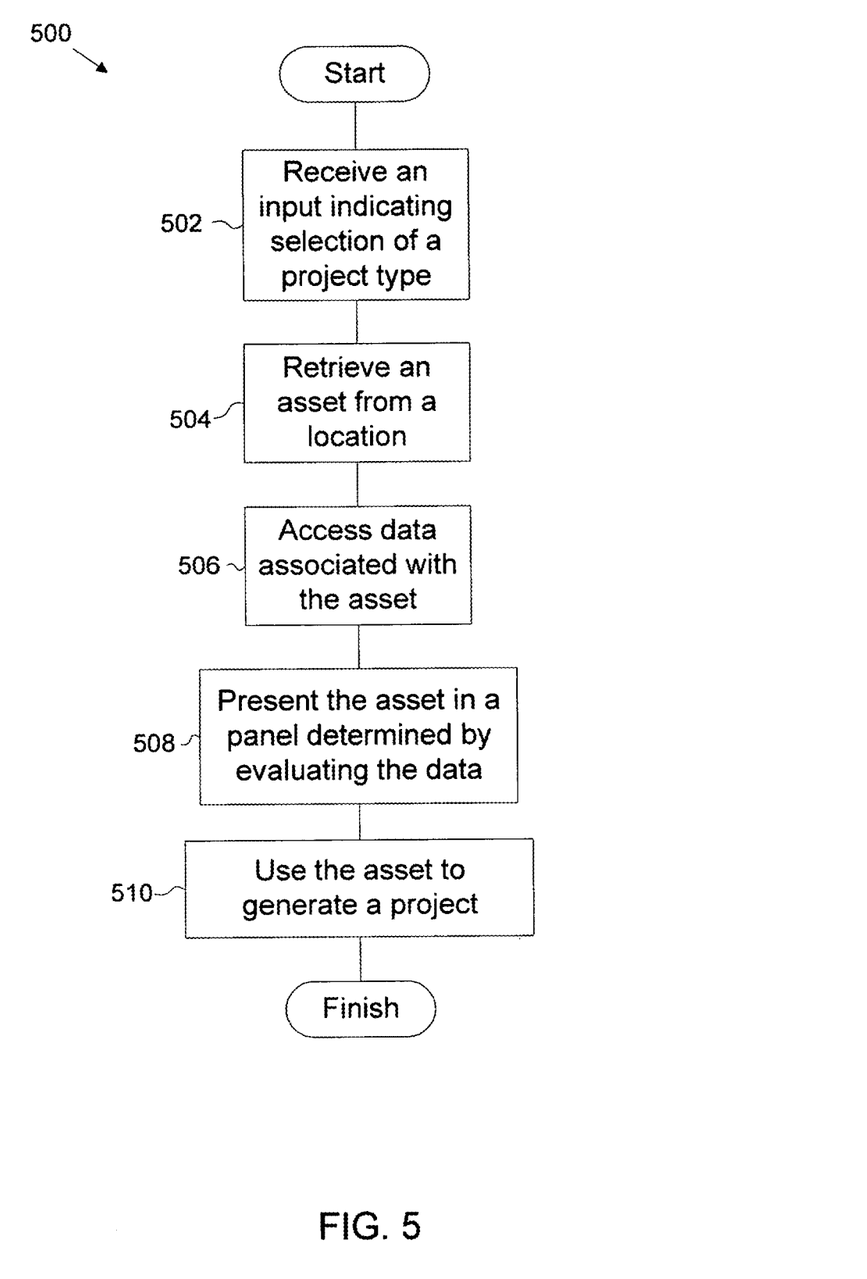
FIG. 5 illustrates an alternative exemplary process for media generation.

FIG. 5 illustrates an alternative exemplary process for media generation. Here, process 500 starts by receiving an input indicating selection of a project type (502). In some examples, an input may be provided by a system, user, or other source, without limitation. In other examples, a project type may be a slideshow, video mash-up, photo album, or others. After receiving an input, an asset may be retrieved from a location, an asset being evaluated to determine a template type for use when configuring one or more panels associated with creating or managing the asset (i.e., media) (504). In some examples, templates may be user-created, developer-created, or otherwise and, when invoked, present panels, functions, tools, or other elements that may be used with a given type of media, asset, or project. In other examples, templates may be created or otherwise determine differently. Templates may be retrieved from a local, remote, combination, distributed, or other type of location (i.e., repository). After an asset is retrieved, data (e.g., metadata, tags, wrapper, or others) associated with the asset may be accessed and used when configuring an application framework to present one or more panels and functions associated with generating or managing the asset or a project associated with the asset (506). Once an asset is retrieved, it may be presented in a panel determined by evaluating the data (508). Further, the asset may be used to generate a project (510). In other examples, the above-described process may be varied and is not limited to the processes or sub-processes described above.

Figure 6:
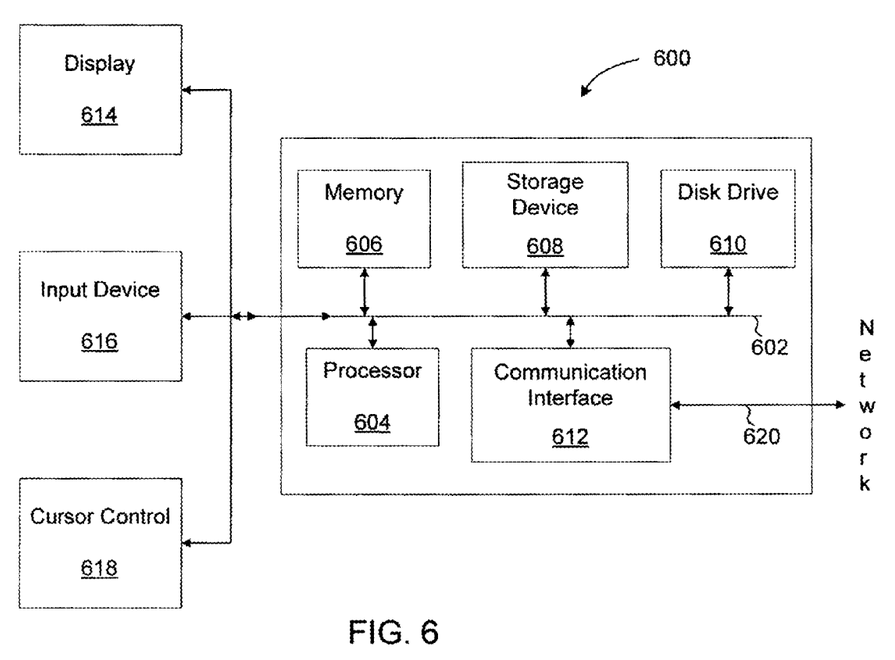
FIG. 6 illustrates an exemplary computer system suitable for media generation.

FIG. 6 illustrates an exemplary computer system suitable for media generation. In some examples, computer system 600 may be used to implement computer programs, applications, methods, processes, or other software to perform the above-described techniques. Computer system 600 includes a bus 602 or other communication mechanism for communicating information, which interconnects subsystems and devices, such as processor 604, system memory 606 (e.g., RAM), storage device 608 (e.g., ROM), disk drive 610 (e.g., magnetic or optical), communication interface 612 (e.g., modem or Ethernet card), display 614 (e.g., CRT or LCD), input device 616 (e.g., keyboard), and cursor control 618 (e.g., mouse or trackball).

According to some examples, computer system 600 performs specific operations by processor 604 executing one or more sequences of one or more instructions stored in system memory 606. Such instructions may be read into system memory 606 from another computer readable medium, such as static storage device 608 or disk drive 610. In some examples, hard-wired circuitry may be used in place of or in combination with software instructions for implementation.

The term "computer readable medium" refers to any tangible medium that participates in providing instructions to processor 604 for execution. Such a medium may take many forms, including but not limited to, non-volatile media and volatile media. Non-volatile media includes, for example, optical or magnetic disks, such as disk drive 610. Volatile media includes dynamic memory, such as system memory 606.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

Instructions may further be transmitted or received using a transmission medium. The term "transmission medium" may include any intangible medium that is capable of storing, encoding or carrying instructions for execution by the machine, and includes digital or analog communications signals or other intangible medium to facilitate communication of such instructions. Transmission media includes coaxial cables, copper wire, and fiber optics, including wires that comprise bus 602 for transmitting a computer data signal.

In some examples, execution of the sequences of instructions may be performed by a single computer system 600. According to some examples, two or more computer systems 600 coupled by communication link 620 (e.g., LAN, PSTN, or wireless network) may perform the sequence of instructions in coordination with one another. Computer system 600 may transmit and receive messages, data, and instructions, including program, i.e., application code, through communication link 620 and communication interface 612. Received program code may be executed by processor 604 as it is received, and/or stored in disk drive 610, or other non-volatile storage for later execution.

The foregoing examples have been described in some detail for purposes of clarity of understanding, but are not limited to the details provided. There are many alternative ways and techniques for implementation. The disclosed examples are illustrative and not restrictive.

What is claimed:

1. A computer-implemented method comprising:
    receiving selection of a graphical representation of an asset from a first panel in a single interface, the first panel including a plurality of graphical representations corresponding to a plurality of assets;
    generating a second panel comprising:
        the selected graphical representation of the asset;
        a description of the asset corresponding to the selected graphical representation of the asset;
        a preview area for presenting modifications to the asset corresponding to the selected graphical representation of the asset;
        a portion configured to receive an additional selection of another graphical representation corresponding to another asset from the first panel of the single interface; and
        selectable options configured to modify the asset corresponding to the selected graphical representation of the asset;
    responsive to generating the second panel, presenting the second panel in the single interface while presenting the first panel that includes the plurality of graphical representations;
    receiving, via the portion presented in the second panel, an additional selection of another graphical representation corresponding to another asset from among the plurality of assets included in the first panel;
    responsive to receiving the additional selection of the other graphical representation via the portion presented in the second panel, creating a project that includes the asset and the other asset;
    presenting, in the second panel of the single interface, an indication of the selected assets that are included in the project; and
    presenting a transition element in the second panel that is configured to manage transitions between presenting the selectable options to modify the asset and presenting selectable options to modify the other asset.

2. The computer-implemented method of claim 1, further comprising, responsive to receiving a selection of at least one selectable option to modify the asset, editing the asset.

3. The computer-implemented method of claim 1, wherein the asset and the other asset are associated with different media types.

4. The computer-implemented method of claim 1, responsive to receiving the selection of the graphical representation of the asset from the first panel in the single interface, determining the selectable options of the second panel in the single interface based, at least in part, on an asset type associated with the asset.

5. The computer-implemented method of claim 1, further comprising receiving a selection of the transition element and transitioning from presenting the selectable options to modify the asset to presenting selectable options to modify the other asset.

6. The computer-implemented method of claim 1, wherein receiving the additional selection in the portion of the second panel is performed via a drag and drop operation.

7. The computer-implemented method of claim 1, further comprising, responsive to receiving the additional selection in the portion of the second panel, associating the asset corresponding to the additional selection with the asset corresponding to the selected graphical representation for editing in the second panel.

8. The computer-implemented method of claim 1, further comprising, responsive to receiving the additional selection in the portion of the second panel, presenting actions associated with the additional selection in the second panel while presenting the selected graphical representation of the asset in the second panel.

9. The computer-implemented method of claim 1, wherein the plurality of assets includes at least two assets each having a different asset type.

10. The computer-implemented method of claim 1, wherein the single interface is configured to enable editing of two or more assets each having a different asset type.

11. A system, comprising:
    one or more processors; and
    memory, communicatively coupled to the one or more processors, storing instructions that, responsive to execution, configure a single interface to:
        present a first panel in the single interface that includes graphical representations corresponding to two or more assets;
        present a second panel in the single interface during presentation of the first panel, the second panel in the single interface comprising:
            selectable options configured to modify an asset corresponding to a selected graphical representation from the first panel of the single interface, the selectable options being determined based, at least in part, on an asset type associated with the asset corresponding to the selected graphical representation in the first panel;

a portion configured to receive a selection of an additional graphical representation presented in the first panel and create a project that includes the asset and an additional asset corresponding to the selected additional graphical representation;

an area configured to present graphical representations of the asset and the additional asset included in the project; and a project builder panel configured to manage, via selection of a transition element presented in the project builder panel, transitions between presenting the selectable options to modify the asset and presenting selectable options to modify the additional asset.

12. The system of claim 11, the second panel of the single interface further comprising a preview area for presenting modifications to the asset corresponding to the selected graphical representation.

13. The system of claim 11, the second panel of the single interface further comprising an asset progress indicator.

14. The system of claim 11, wherein the project builder panel is further configured to provide a visible indication of the assets that are included in project and the portion being displayed in the second panel of the single interface.

15. A computer-readable storage medium, excluding signals per se, storing instructions that, responsive to execution, direct a computing device to perform operations comprising:

receiving a selection of a first asset in a first panel of a single interface;

responsive to receiving the selection of the first asset, determining an asset type for the selected first asset;

generating a set of functions configured to edit the selected first asset, the set of functions being generated based, at least in part, on the determined asset type;

presenting, in a second panel of the single interface, the generated set of functions configured to edit the selected first asset;

receiving a selection of a second asset via a portion presented in the second panel while presenting the generated set of functions in the second panel of the single interface, the selected second asset corresponding to an asset type that is different from the determined asset type of the selected first asset;

responsive to receiving the selection of the second asset via the portion presented in the second panel, creating a project that includes the first asset and the second asset; and enabling editing of the selected first asset and the selected second asset via the second panel of the single interface responsive to a selection of a control in the second panel that causes transition between presentation of the generated set of functions configured to edit the selected first asset and presentation of a set of functions configured to edit the selected second asset.

16. The computer-readable storage medium of claim 15, wherein enabling editing of the selected first asset and the selected second asset via the second panel of the single interface comprises employing graphics editing functionality and audio editing functionality.

17. The computer-readable storage medium of claim 15, wherein the selected first asset comprises a video file and the selected second asset comprises an audio file.

18. The computer-readable storage medium of claim 15, wherein enabling editing of the selected first asset and the selected second asset via the second panel of the single interface comprises:

generating the set of functions configured to edit the selected second asset based, at least in part, on an asset type of the selected second asset.

19. The computer-readable storage medium of claim 15, wherein enabling editing of the selected first asset and the selected second asset via the second panel of the single interface comprises:

generating the set of functions configured to edit the selected second asset based, at least in part, on an asset type of the selected second asset; and replacing the generated set of functions configured to edit the selected first asset in the second panel of the single interface with the generated second set of functions configured to edit the selected second asset.

20. The computer-readable storage medium of claim 15, wherein receiving the selection of the second asset in the first panel of the single interface comprises dragging the selected second asset from the first panel to the portion presented within the second panel.

* * * * *